United States Patent
Ono et al.

(10) Patent No.: US 12,384,962 B2
(45) Date of Patent: Aug. 12, 2025

(54) PHOTODETECTOR ELEMENT, MANUFACTURING METHOD FOR PHOTODETECTOR ELEMENT, AND IMAGE SENSOR

(71) Applicant: FUJIFILM Corporation, Tokyo (JP)

(72) Inventors: Masashi Ono, Kanagawa (JP); Masahiro Takata, Kanagawa (JP); Tetsushi Miyata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 923 days.

(21) Appl. No.: 17/541,209

(22) Filed: Dec. 2, 2021

(65) Prior Publication Data

US 2022/0093887 A1  Mar. 24, 2022

Related U.S. Application Data (63) Continuation of application No. PCT/JP2020/020405, filed on May 22, 2020.

(30) Foreign Application Priority Data

Jul. 1, 2019 (JP) .................. 2019-123106

(51) Int. Cl.
*C09K 11/02* (2006.01)
*C09K 11/66* (2006.01)
(Continued)

(52) U.S. Cl.
CPC .......... *C09K 11/025* (2013.01); *C09K 11/661* (2013.01); *H04N 23/20* (2023.01);
(Continued)

(58) Field of Classification Search
CPC .... C09K 11/025; C09K 11/661; H04N 23/20; H10K 30/35; H10K 30/87; H10K 39/32;
(Continued)

(56) References Cited

U.S. PATENT DOCUMENTS

| | | |
|---|---|---|
| 6,111,266 A | 8/2000 | Carline et al. |
| 8,895,840 B2 | 11/2014 | Suto |

(Continued)

FOREIGN PATENT DOCUMENTS

| | | |
|---|---|---|
| CN | 102473746 | 5/2012 |
| CN | 109119509 | 1/2019 |

(Continued)

OTHER PUBLICATIONS

"Notice of Reasons for Refusal of Japan Counterpart Application", issued on Apr. 11, 2023, with English translation thereof, p. 1-p. 12.
(Continued)

*Primary Examiner* — Patricia D Valenzuela
(74) *Attorney, Agent, or Firm* — JCIPRNET (57) ABSTRACT

A photodetector element includes a photoelectric conversion layer that contains aggregates of semiconductor quantum dots between a first electrode layer and a second electrode layer, where the first electrode layer is provided on a light incident side with respect to the second electrode layer, and a wavelength λ (nm) of target light to be detected by the photodetector element and an optical path length $L^\lambda$ (nm) of light having the wavelength λ, from a surface of the second electrode layer on a side of the photoelectric conversion layer to a surface of the photoelectric conversion layer on a side of the first electrode layer satisfy a relationship of the following Expression (1). m is an integer of 0 or more.

$$0.05 + m/2 \leq L^\lambda / \lambda \leq 0.35 + m/2 \quad (1)$$

12 Claims, 1 Drawing Sheet

(51) Int. Cl.
  *H04N 23/20* (2023.01)
  *H10K 30/35* (2023.01)
  *H10K 30/87* (2023.01)
  *H10K 39/32* (2023.01)
  *B82Y 20/00* (2011.01)
  *B82Y 40/00* (2011.01)

(52) U.S. Cl.
  CPC ............ *H10K 30/35* (2023.02); *H10K 30/87* (2023.02); *H10K 39/32* (2023.02); *B82Y 20/00* (2013.01); *B82Y 40/00* (2013.01); *H10K 30/352* (2023.02)

(58) Field of Classification Search
  CPC ...... H10K 30/352; B82Y 20/00; B82Y 40/00; B82Y 15/00; H10F 30/20; Y02E 10/549
  See application file for complete search history.

(56) References Cited

U.S. PATENT DOCUMENTS

| | | | |
|---|---|---|---|
| 10,777,699 | B2 | 9/2020 | Nozawa |
| 10,847,669 | B1 | 11/2020 | Nozawa |
| 11,282,873 | B2 | 3/2022 | Yamashita |
| 2009/0145481 | A1 | 6/2009 | Hu et al. |
| 2012/0193543 | A1* | 8/2012 | Kaneko ............... G01T 1/202 250/369 |
| 2015/0318421 | A1* | 11/2015 | Ono ............... H10F 77/1433 257/14 |
| 2016/0211392 | A1 | 7/2016 | So et al. |
| 2018/0190854 | A1 | 7/2018 | Bower et al. |
| 2018/0198005 | A1 | 7/2018 | Siegmund et al. |

FOREIGN PATENT DOCUMENTS

| | | |
|---|---|---|
| JP | H11507178 | 6/1999 |
| JP | 4673398 | 4/2011 |
| JP | 2013179280 | 9/2013 |
| JP | 2013254912 | 12/2013 |
| JP | 2014093328 | 5/2014 |
| JP | 2016532301 | 10/2016 |
| JP | 2017174954 | 9/2017 |
| JP | 2018525831 | 9/2018 |
| JP | 2018527742 | 9/2018 |
| JP | 2019062094 | 4/2019 |
| KR | 1020160078954 | 7/2016 |
| TW | 200926430 | 6/2009 |
| WO | 2018128128 | 7/2018 |
| WO | 2019110971 | 6/2019 |

OTHER PUBLICATIONS

"Office Action of Korea Counterpart Application", issued on Aug. 30, 2023, with English translation thereof, p. 1-p. 19.

"Notice of Reasons for Refusal of Japan Counterpart Application", issued on Nov. 1, 2022, with English translation thereof, p. 1-p. 8.

"International Search Report (Form PCT/ISA/210) of PCT/JP2020/020405," mailed on Jul. 7, 2020, with English translation thereof, pp. 1-7.

"Written Opinion of the International Searching Authority (Form PCT/ISA/237)" of PCT/JP2020/020405, mailed on Jul. 7, 2020, with English translation thereof, pp. 1-10.

"Office Action of Taiwan Counterpart Application", issued on May 30, 2024, with partial English translation thereof, p. 1- p. 11.

* cited by examiner

PHOTODETECTOR ELEMENT, MANUFACTURING METHOD FOR PHOTODETECTOR ELEMENT, AND IMAGE SENSOR

CROSS-REFERENCE TO RELATED APPLICATIONS

This application is a Continuation of PCT International Application No. PCT/JP2020/020405 filed on May 22, 2020, which claims priority under 35 U.S.C § 119(a) to Japanese Patent Application No. 2019-123106 filed on Jul. 1, 2019. Each of the above application(s) is hereby expressly incorporated by reference, in its entirety, into the present application.

BACKGROUND OF THE INVENTION

1. Field of the Invention

The present invention relates to a photodetector element having a photoelectric conversion layer that contains semiconductor quantum dots, a manufacturing method for a photodetector element, and an image sensor.

2. Description of the Related Art

In recent years, attention has been focused on photodetector elements capable of detecting light in the infrared region in the fields such as smartphones, surveillance cameras, and in-vehicle cameras.

In the related art, a silicon photodiode in which a silicon wafer is used as a material of a photoelectric conversion layer has been used in a photodetector element that is used in an image sensor or the like. However, a silicon photodiode has low sensitivity in the infrared region having a wavelength of 900 nm or more.

In addition, an InGaAs-based semiconductor material known as a near-infrared light-receiving element has a problem in that it requires extremely high-cost processes such as epitaxial growth for achieving high quantum efficiency, and thus it has not been widespread.

By the way, in recent years, research on semiconductor quantum dots has been advanced. For example, JP2016-532301A describes an invention relating to a photodetector using PbS quantum dots as a photoactive layer.

SUMMARY OF THE INVENTION

In recent years, with the demand for performance improvement of an image sensor the like, further improvement of various characteristics that is required in a photodetector element used in the image sensor the like is also required. For example, further improvement of the external quantum efficiency of the photodetector element is required. In a case where the external quantum efficiency of the photodetector element is improved, the sensitivity of the photodetector element can be further improved.

However, according to the study of the inventors of the present invention, it was found that the photodetector element having a photoelectric conversion layer using semiconductor quantum dots has room for improvement in external quantum efficiency. In addition, it was also found that the invention described in JP2016-532301A also has room for improvement in external quantum efficiency.

An object of the present invention is to provide a photodetector element having a high external quantum efficiency, a manufacturing method for a photodetector element, and an image sensor.

According to the study of the inventors of the present invention, it has been found that the above problems can be solved by adopting the following configurations, and the present invention has been completed. The present invention provides the following.

<1> A photodetector element comprising:
a photoelectric conversion layer that contains aggregates of semiconductor quantum dots between a first electrode layer and a second electrode layer,
in which the first electrode layer is provided on a light incident side with respect to the second electrode layer, and
a wavelength $\lambda$ (nm) of target light to be detected by the photodetector element and an optical path length $L^{\lambda}$ (nm) of light having the wavelength from a surface of the second electrode layer on a side of the photoelectric conversion layer to a surface of the photoelectric conversion layer on a side of the first electrode layer satisfy a relationship of the following Expression (1);

$$0.05+m/2 \leq L^{\lambda}/\lambda \leq 0.35+m/2 \tag{1}$$

in the expression, $\lambda$ is the wavelength of the target light to be detected by the photodetector element,
$L^{\lambda}$ is the optical path length of the light having the wavelength $\lambda$ from a surface of the second electrode layer on a side of the photoelectric conversion layer to a surface of the photoelectric conversion layer on a side of the first electrode layer, and
m is an integer of 0 or more.

<2> The photodetector element according to <1>, in which the wavelength $\lambda$ of the target light to be detected by the photodetector element and the optical path length $L^{\lambda}$ of the light having the wavelength $\lambda$ from a surface of the second electrode layer on a side of the photoelectric conversion layer to a surface of the photoelectric conversion layer on a side of the first electrode layer satisfy a relationship of the following Expression (2);

$$0.10+m/2 \leq L^{\lambda}/\lambda \leq 0.30+m/2 \tag{2}$$

in the expression, $\lambda$ is the wavelength of the target light to be detected by the photodetector element,
$L^{\lambda}$ is the optical path length of the light having the wavelength $\lambda$ from a surface of the second electrode layer on a side of the photoelectric conversion layer to a surface of the photoelectric conversion layer on a side of the first electrode layer, and
m is an integer of 0 or more.

<3> The photodetector element according to <1> or <2>, in which m is an integer of 0 to 4.
<4> The photodetector element according to <1> or <2>, in which m is an integer of 0 to 2.
<5> The photodetector element according to any one of <1> to <4>, in which the photoelectric conversion layer has a film thickness of 150 to 600 nm.
<6> The photodetector element according to any one of <1> to <5>, in which the semiconductor quantum dot contains a Pb atom.
<7> The photodetector element according to any one of <1> to <6>, in which the semiconductor quantum dot contains PbS.

<8> The photodetector element according to any one of <1> to <7>, in which the photoelectric conversion layer contains a ligand that is coordinated to the semiconductor quantum dot.

<9> The photodetector element according to <8>, in which the ligand contains at least one selected from a ligand containing a halogen atom or a polydentate ligand containing two or more coordination moieties.

<10> The photodetector element according to any one of <1> to <9>, in which a refractive index of the photoelectric conversion layer with respect to the light having the wavelength λ is 2 to 3.

<11> The photodetector element according to any one of <1> to <10>, further comprising a charge transport layer between the photoelectric conversion layer and the second electrode layer.

<12> The photodetector element according to any one of <1> to <11>, in which the target light to be detected by the photodetector element is light having a wavelength range of 900 to 1,600 nm.

<13> A manufacturing method for the photodetector element according to any one of <1> to <12>, the manufacturing method comprising:

a step of using a dispersion liquid that contains semiconductor quantum dots, a ligand that is coordinated to the semiconductor quantum dot, and a solvent, to form a film of aggregates of the semiconductor quantum dots.

<14> An image sensor comprising the photodetector element according to any one of <1> to <12>.

According to the present invention, it is possible to provide a photodetector element having a high external quantum efficiency, a manufacturing method for a photodetector element, and an image sensor.

DESCRIPTION OF THE PREFERRED EMBODIMENTS

Hereinafter, the contents of the present invention will be described in detail.

In the present specification, "to" is used to mean that numerical values described before and after "to" are included as a lower limit value and an upper limit value, respectively.

In describing a group (an atomic group) in the present specification, in a case where a description about substitution and non-substitution is not provided, the description means the group includes a group (an atomic group) having a substituent as well as a group (an atomic group) having no substituent. For example, the "alkyl group" includes not only an alkyl group that does not have a substituent (an unsubstituted alkyl group) but also an alkyl group that has a substituent (a substituted alkyl group).

<Photodetector Element>

The photodetector element according to the embodiment of the present invention is characterized the following:

the photodetector element includes a photoelectric conversion layer that contains aggregates of semiconductor quantum dots between a first electrode layer and a second electrode layer, where the first electrode layer is provided on a light incident side with respect to the second electrode layer, and a wavelength λ (nm) of target light to be detected by the photodetector element and an optical path length $L^\lambda$ (nm) of light having the wavelength λ from a surface of the second electrode layer on a side of the photoelectric conversion layer to a surface of the photoelectric conversion layer on a side of the first electrode layer satisfy a relationship of the following Expression (1).

$$0.05+m/2 \leq L^\lambda/\lambda \leq 0.35+m/2 \qquad (1)$$

In Expression (1), λ is the wavelength of the target light to be detected by the photodetector element, $L^\lambda$ is the optical path length of the light having the wavelength λ from a surface of the second electrode layer on a side of the photoelectric conversion layer to a surface of the photoelectric conversion layer on a side of the first electrode layer, and m is an integer of 0 or more.

The photodetector element according to the embodiment of the present invention has a high quantum efficiency. More specifically, the photodetector element according to the embodiment of the present invention has a high external quantum efficiency with respect to the light having the wavelength λ. Although it is a presumption, the reason why such effects are obtained is presumed to be as follows. That is, it is presumed that in a case where the wavelength λ and the optical path length $L^\lambda$ satisfy the relationship of Expression (1), it is possible to arrange a phase of light (incidence ray) incident on the photoelectric conversion layer from the side of the first electrode layer in the photoelectric conversion layer and a phase of light (reflected light) reflected on the surface of the second electrode layer and incident on the photoelectric conversion layer, and as a result, the light is intensified by the optical interference effect, whereby it is possible to obtain a higher external quantum efficiency with respect to the light of the wavelength λ.

Here, the optical path length means the product obtained by multiplying the physical thickness of a substance through which light transmits by the refractive index. To describe with the photoelectric conversion layer as an example, in a case where the thickness of the photoelectric conversion layer is denoted by $d^1$ and the refractive index of the photoelectric conversion layer with respect to the wavelength $\lambda^1$ is denoted by $N^1$, the optical path length of the light having a wavelength $\lambda^1$ (nm) and transmitting through the photoelectric conversion layer is $N^1 \times d^1$. In a case where the photoelectric conversion layer is composed of two or more laminated films or in a case where an interlayer described later is present between the photoelectric conversion layer and the second electrode layer, the integrated value of the optical path length of each layer is the optical path length $L^\lambda$.

In the photodetector element according to the embodiment of the present invention, it is preferable that a wavelength λ of target light to be detected by the photodetector element and an optical path length $L^\lambda$ (nm) of light having the wavelength (nm) from a surface of the second electrode layer on a side of the photoelectric conversion layer to a surface of the photoelectric conversion layer on a side of the first electrode layer satisfy the following Expression (2). According to this aspect, the external quantum efficiency of the photodetector element can be further increased.

$$0.10+m/2 \leq L^\lambda/\lambda \leq 0.30+m/2 \qquad (2)$$

In Expression (2), λ is the wavelength of the target light to be detected by the photodetector element, $L^\lambda$ is the optical path length of the light having the wavelength λ from a surface of the second electrode layer on a side of the photoelectric conversion layer to a surface of the photoelectric conversion layer on a side of the first electrode layer, and m is an integer of 0 or more.

In Expressions (1) and (2), m is preferably an integer of 0 to 4, more preferably an integer of 0 to 3, and still more preferably an integer of 0 to 2. According to this aspect, the transport characteristics of charges such as the hole and the electron are good, and thus it is possible to increase the external quantum efficiency of the photodetector element.

The target light to be detected by the photodetector element is preferably light having a wavelength in the infrared region. That is, the wavelength λ is preferably a wavelength in the infrared region. In addition, the light having a wavelength in the infrared region is preferably light having a wavelength of more than 700 nm, more preferably light having a wavelength of 800 nm or more, and still more preferably light having a wavelength of 900 nm or more. In addition, the light having a wavelength in the infrared region is preferably light having a wavelength of 2,000 nm or less, more preferably light having a wavelength of 1,800 nm or less, and still more preferably light having a wavelength of 1,600 nm or less. The target light to be detected by the photodetector element is preferably light in a wavelength range of 900 to 1,600 nm.

In addition, the photodetector element according to the embodiment of the present invention is preferably an infrared photodetector element.

The photodetector element according to the embodiment of the present invention may be one that selectively detects only the light having the wavelength λ or may be one that simultaneously detects the light having the wavelength λ and light having a wavelength different from the light having the wavelength λ. For example, in a case where the light having the wavelength λ is light having a wavelength in the infrared region, it may be one that simultaneously detects light having a wavelength in the infrared region, which is the light having the wavelength λ, and light having a wavelength in the visible region (preferably light having a wavelength in a range of 400 to 700 nm).

Figure 1:
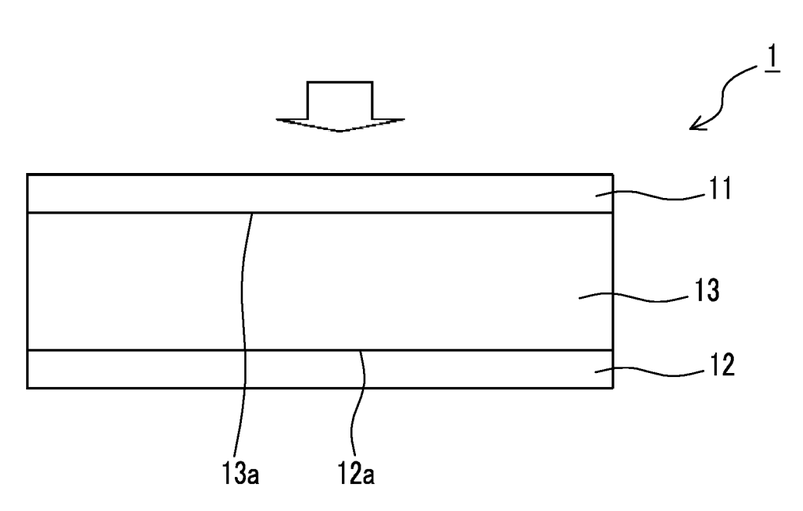
FIG. 1 is a diagram illustrating an embodiment of a photodetector element.

Hereinafter, the details of the photodetector element according to the embodiment of the present invention will be described with reference to the drawing. FIG. 1 is a diagram illustrating an embodiment of a photodetector element. It is noted that an arrow in the FIGURE represents the incidence ray on the photodetector element. The photodetector element 1 illustrated in FIG. 1 includes a second electrode layer 12, a first electrode layer 11 opposite to the second electrode layer 12, and a photoelectric conversion layer 13 provided between the second electrode layer 12 and the first electrode layer 11. The photodetector element 1 illustrated in FIG. 1 is used by causing light to be incident from above the first electrode layer 11.

(First Electrode Layer)

The first electrode layer 11 is preferably a transparent electrode formed of a conductive material that is substantially transparent with respect to the wavelength λ of the target light to be detected by the photodetector element. It is noted that in the present invention, the description of "substantially transparent" means that the transmittance is 50% or more, preferably 60% or more, and particularly preferably 80% or more. Examples of the material of the first electrode layer 11 include a conductive metal oxide. Specific examples thereof include tin oxide, zinc oxide, indium oxide, indium tungsten oxide, indium zinc oxide (IZO), indium tin oxide (ITO), and a fluorine-doped tin oxide (FTO).

The film thickness of the first electrode layer 11 is not particularly limited, and it is preferably 0.01 to 100 μm, more preferably 0.01 to 10 μm, and particularly preferably 0.01 to 1 μm. It is noted that in the present invention, the thickness of each layer can be measured by observing the cross section of the photodetector element 1 using a scanning electron microscope (SEM) or the like.

(Second Electrode Layer)

Examples of the material that forms the second electrode layer 12 include a metal such as platinum, gold, nickel, copper, silver, indium, ruthenium, palladium, rhodium, iridium, osmium, or aluminum, the above-described conductive metal oxide, a carbon material, and a conductive polymer. The carbon material may be any material having conductivity, and examples thereof include fullerene, a carbon nanotube, graphite, and graphene.

The second electrode layer 12 is preferably a thin film of a metal or conductive metal oxide (including a thin film formed by vapor deposition), or a glass substrate or plastic substrate having this thin film. The glass substrate or the plastic substrate is preferably glass having a thin film of gold or platinum, or glass on which platinum is vapor-deposited. The film thickness of the second electrode layer 12 is not particularly limited, and it is preferably 0.01 to 100 μm, more preferably 0.01 to 10 μm, and particularly preferably 0.01 to 1 μm.

(Photoelectric Conversion Layer)

The photoelectric conversion layer 13 contains aggregates of semiconductor quantum dots. The aggregate of semiconductor quantum dots means a form in which a large number of semiconductor quantum dots (for example, 100 or more quantum dots per 1 μm$^2$) are arranged close to each other. In addition, the "semiconductor" in the present invention means a substance having a specific resistance value of $10^{-2}$ Ω·cm or more and $10^8$ Ω·cm or less.

The semiconductor quantum dots preferably have a metal atom. In addition, the semiconductor quantum dots are preferably a semiconductor particle having a metal atom. It is noted that in the present invention, the metal atom also includes a metalloid atom represented by a Si atom. Examples of the semiconductor quantum dot material that constitutes the semiconductor quantum dot include a nano particle (a particle having a size of 0.5 nm or more and less than 100 nm) of a general semiconductor crystal [a) a Group IV semiconductor, b) a compound semiconductor of a Group IV to IV element, a Group III to V element, or a Group II to VI element, or c) a compound semiconductor consisting of a combination of three or more of a Group II element, a Group III element, a Group IV element, a Group V element, and a Group VI element].

The semiconductor quantum dot preferably contains at least one metal atom selected from a Pb atom, an In atom, a Ge atom, a Si atom, a Cd atom, a Zn atom, a Hg atom, an Al atom, a Sn atom, or a Ga atom, more preferably at least one metal atom selected from a Pb atom, an In atom, a Ge atom, or a Si atom, and due to the reason that a high external quantum efficiency is easily obtained more remarkably with respect to the light having a wavelength in the infrared region, it still more contains a Pb atom.

Specific examples of the semiconductor quantum dot material that constitutes the semiconductor quantum dot include semiconductor materials having a relatively narrow band gap, such as PbS, PbSe, PbSeS, InN, InAs, Ge, InAs, InGaAs, CuInS, CuInSe, CuInGaSe, InSb, HgTe, HgCdTe, $Ag_2S$, $Ag_2Se$, $Ag_2Te$, SnS, SnSe, SnTe, Si, and InP. Among them, the semiconductor quantum dot preferably contains PbS or PbSe, and more preferably contains PbS, due to the reason that a high external quantum efficiency is easily obtained with respect to the light having a wavelength in the infrared region.

The semiconductor quantum dot may be a material having a core-shell structure in which a semiconductor quantum dot material is made to the nucleus (the core) and the semiconductor quantum dot material is covered with a coating compound. Examples of the coating compound include ZnS, ZnSe, ZnTe, ZnCdS, CdS, and GaP.

The band gap of the semiconductor quantum dot is preferably 0.5 to 2.0 eV. In a case where the band gap of the semiconductor quantum dot is within the above range, it is possible to obtain a photodetector element capable of detecting light having a wavelength in the infrared region. The upper limit of the band gap of the semiconductor quantum dot is preferably 1.9 eV or less, more preferably 1.8 eV or less, and still more preferably 1.5 eV or less. The lower limit of the band gap of the semiconductor quantum dot is preferably 0.6 eV or more and more preferably 0.7 eV or more.

The average particle diameter of the semiconductor quantum dots are preferably 2 nm to 15 nm. The average particle diameter of the semiconductor quantum dots refers to the average particle diameter of ten semiconductor quantum dots. A transmission electron microscope may be used for measuring the particle diameter of the semiconductor quantum dots.

Generally, a semiconductor quantum dot contains particles of various sizes from several nm to several tens of nm. In the semiconductor quantum dot, in a case where the average particle diameter of semiconductor quantum dots are reduced to a size equal to or smaller than the Bohr radius of the internal electrons, a phenomenon in which the band gap of the semiconductor quantum dot changes due to the quantum size effect occurs. In a case where the average particle diameter of semiconductor quantum dots are 15 nm or less, it is easy to control the band gap by the quantum size effect.

The photoelectric conversion layer 13 preferably contains a ligand that is coordinated to the semiconductor quantum dot. According to this aspect, it is easy to obtain a photodetector element excellent in an electrical conductivity, a photocurrent value, an external quantum efficiency, an in-plane uniformity of external quantum efficiency, and the like. Examples of the ligand include a ligand containing a halogen atom and a polydentate ligand containing two or more coordination moieties. The photoelectric conversion layer 13 may contain only one kind of ligand or may contain two or more kinds of ligands. Among the above, the photoelectric conversion layer 13 preferably contains a ligand containing a halogen atom and a polydentate ligand. According to this aspect, it is possible to further improve an electrical conductivity, a photocurrent value, an external quantum efficiency, an in-plane uniformity of external quantum efficiency, and the like. It is presumed that the reason why such effects are obtained is as follows. It is presumed that the polydentate ligand is subjected to chelate coordination to the semiconductor quantum dot, and thus it is presumed that the peeling of the ligand from the semiconductor quantum dot can be suppressed more effectively. In addition, it is presumed that steric hindrance between semiconductor quantum dots can be suppressed by chelate coordination. For this reason, it is conceived that the steric hindrance between the semiconductor quantum dots are reduced, and thus the semiconductor quantum dots are closely arranged to strengthen the overlap of the wave functions between the semiconductor quantum dots. Furthermore, in a case where a ligand containing a halogen atom is further contained as the ligand that is coordinated to the semiconductor quantum dot, it is presumed that the ligand containing a halogen atom is coordinated in the gap where the polydentate ligand is not coordinated, and thus it is presumed that the surface defects of the semiconductor quantum dot can be reduced. As a result, it is presumed that it is possible to further improve an electrical conductivity, a photocurrent value, an external quantum efficiency, an in-plane uniformity of external quantum efficiency, and the like.

First, the ligand containing a halogen atom will be described. Examples of the halogen atom contained in the ligand containing a halogen atom include a fluorine atom, a chlorine atom, a bromine atom, and an iodine atom, and an iodine atom is preferable from the viewpoint of coordinating power.

The ligand containing a halogen atom may be an organic halide or may be an inorganic halide. Among the above, an inorganic halide is preferable due to the reason that it is easily coordinated to both the cation site and the anion site of the semiconductor quantum dot. In addition, the inorganic halide is preferably a compound containing at least one selected from a Group 12 element or a Group 13 element. Among the above, the inorganic halide is preferably a compound containing a metal atom selected from a Zn atom, an In atom, and a Cd atom, and it is more preferably a compound containing a Zn atom. The inorganic halide is preferably a salt of a metal atom and a halogen atom due to the reason that the salt is ionized and easily coordinated to the semiconductor quantum dot.

Specific examples of the ligand containing a halogen atom include zinc iodide, zinc bromide, zinc chloride, indium iodide, indium bromide, indium chloride, cadmium iodide, cadmium bromide, and cadmium chloride, gallium iodide, gallium bromide, gallium chloride, and tetrabutylammonium iodide, and zinc iodide is particularly preferable.

In the ligand containing a halogen atom, the halogen ion may be dissociated from the ligand containing a halogen atom, and the halogen ion may be coordinated on the surface of the semiconductor quantum dot. In addition, a portion of the ligand containing a halogen atom, other than the halogen, may also be coordinated on the surface of the semiconductor quantum dot. To describe with a specific example, in the case of zinc iodide, zinc iodide may be coordinated on the surface of the semiconductor quantum dot, or the iodine ion or the zinc ion may be coordinated on the surface of the semiconductor quantum dot.

Next, the polydentate ligand will be described. Examples of the coordination moiety contained in the polydentate ligand include a thiol group, an amino group, a hydroxy group, a carboxy group, a sulfo group, a phospho group, and a phosphonic acid group. The polydentate ligand is preferably a compound containing a thiol group due to the reason that the compound is easily coordinated firmly on the surface of the semiconductor quantum dot.

Examples of the polydentate ligand include a ligand represented by any one of Formulae (D) to (F).

(D)

(E)

-continued (F)

In Formula (D), $X^{D1}$ and $X^{D2}$ each independently represent a thiol group, an amino group, a hydroxy group, a carboxy group, a sulfo group, a phospho group, or a phosphonic acid group, and $L^{D1}$ represents a hydrocarbon group.

In Formula (E), $X^{E1}$ and $X^{E2}$ each independently represent a thiol group, an amino group, a hydroxy group, a carboxy group, a sulfo group, a phospho group, or a phosphonic acid group, $X^{E3}$ represents S, O, or NH, and $L^{E1}$ and $L^{E2}$ each independently represent a hydrocarbon group.

In Formula (F), $X^{F1}$ to $X^{F3}$ each independently represent a thiol group, an amino group, a hydroxy group, a carboxy group, a sulfo group, a phospho group, or a phosphonic acid group, $X^{F4}$ represents N, and $L^{F1}$ to $L^{F3}$ each independently represent a hydrocarbon group.

The amino group represented by $X^{D1}$, $X^{D2}$, $X^{E1}$, $X^{E2}$, $X^{F1}$, $X^{F2}$, or $X^{F3}$ is not limited to —$NH_2$ and includes a substituted amino group and a cyclic amino group as well. Examples of the substituted amino group include a monoalkylamino group, a dialkylamino group, a monoarylamino group, a diarylamino group, and an alkylarylamino group. The amino group represented by these groups is preferably —$NH_2$, a monoalkylamino group, or a dialkylamino group, and —$NH_2$ is more preferable.

The hydrocarbon group represented by $L^{D1}$, $L^{E1}$, $L^{E2}$, $L^{F1}$, $L^{F2}$, or $L^{F3}$ is preferably an aliphatic hydrocarbon group. The aliphatic hydrocarbon group may be a saturated aliphatic hydrocarbon group or may be an unsaturated aliphatic hydrocarbon group. The hydrocarbon group preferably has 1 to 20 carbon atoms. The upper limit of the number of carbon atoms is preferably 10 or less, more preferably 6 or less, and still more preferably 3 or less. Specific examples of the hydrocarbon group include an alkylene group, an alkenylene group, and an alkynylene group.

Examples of the alkylene group include a linear alkylene group, a branched alkylene group, and a cyclic alkylene group. A linear alkylene group or a branched alkylene group is preferable, and a linear alkylene group is more preferable. Examples of the alkenylene group include a linear alkenylene group, a branched alkenylene group, and a cyclic alkenylene group. A linear alkenylene group or a branched alkenylene group is preferable, and a linear alkenylene group is more preferable. Examples of the alkynylene group include a linear alkynylene group and a branched alkynylene group, and a linear alkynylene group is preferable. The alkylene group, the alkenylene group, and the alkynylene group may further have a substituent. The substituent is preferably a group having 1 or more and 10 or less atoms. Preferred specific examples of the group having 1 to 10 atoms include an alkyl group having 1 to 3 carbon atoms [a methyl group, an ethyl group, a propyl group, or an isopropyl group], an alkenyl group having 2 or 3 carbon atoms [an ethenyl group or a propenyl group], an alkynyl group having 2 to 4 carbon atoms [an ethynyl group, a propynyl group, or the like], a cyclopropyl group, an alkoxy group having 1 or 2 carbon atoms [a methoxy group or an ethoxy group], an acyl group having 2 or 3 carbon atoms [an acetyl group or a propionyl group], an alkoxycarbonyl group having 2 or 3 carbon atoms [a methoxycarbonyl group or an ethoxycarbonyl group], an acyloxy group having 2 carbon atoms [an acetyloxy group], an acylamino group having 2 carbon atoms [an acetylamino group], a hydroxyalkyl group having 1 to 3 carbon atoms [a hydroxymethyl group, a hydroxyethyl group, or a hydroxypropyl group], an aldehyde group, a hydroxy group, a carboxy group, a sulfo group, a phospho group, a carbamoyl group, a cyano group, an isocyanate group, a thiol group, a nitro group, a nitroxy group, an isothiocyanate group, a cyanate group, a thiocyanate group, an acetoxy group, an acetamide group, a formyl group, a formyloxy group, a formamide group, a sulfamino group, a sulfino group, a sulfamoyl group, a phosphono group, an acetyl group, a halogen atom, and an alkali metal atom.

In Formula (D), $X^{D1}$ and $X^{D2}$ are separated by $L^{D1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (E), $X^{E1}$ and $X^{E3}$ are separated by $L^{E1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{E2}$ and $X^{E3}$ are separated by $L^{E2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (F), $X^{F1}$ and $X^{F4}$ are separated by $L^{F1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{F2}$ and $X^{F4}$ are separated by $L^{F2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{F3}$ and $X^{F4}$ are separated by $L^{F3}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

It is noted that the description that $X^{D1}$ and $X^{D2}$ are separated by $L^{D1}$ by 1 to 10 atoms means that the number of atoms that constitute the shortest molecular chain connecting $X^{D1}$ and $X^{D2}$ is 1 to 10 atoms. For example, in a case of Formula (D1), $X^{D1}$ and $X^{D2}$ are separated by two atoms, and in cases of Formulae (D2) and (D3), $X^{D1}$ and $X^{D2}$ are separated by 3 atoms. The numbers added to the following structural formulae represent the arrangement order of atoms constituting the shortest distance molecular chain connecting $X^{D1}$ and $X^{D2}$.

(D1)

(D2)

(D3)

To describe with a specific compound, 3-mercaptopropionic acid is a compound (a compound having the following structure) having a structure in which a portion corresponding to $X^{D1}$ is a carboxy group, a portion corresponding to $X^{D2}$ is a thiol group, and a portion corresponding to $L^{D1}$ is an ethylene group. In 3-mercaptopropionic acid, $X^{D1}$ (the carboxy group) and $X^{D2}$ (the thiol group) are separated by $L^{D1}$ (the ethylene group) by two atoms.

The same applies to the meanings that $X^{E1}$ and $X^{E3}$ are separated by $L^{E1}$ by 1 to 10 atoms, $X^{E2}$ and $X^{E3}$ are separated by $L^{E2}$ by 1 to 10 atoms, $X^{F1}$ and $X^{F4}$ are separated by $L^{F1}$ by 1 to 10 atoms, $X^{F2}$ and $X^{F4}$ are separated by $L^{F2}$ by 1 to 10 atoms, and $X^{F3}$ and $X^{F4}$ are separated by $L^{F3}$ by 1 to 10 atoms.

Specific examples of the polydentate ligand include 3-mercaptopropionic acid, thioglycolic acid, 2-aminoethanol, 2-aminoethanethiol, 2-mercaptoethanol, glycolic acid, diethylenetriamine, tris(2-aminoethyl)amine, 4-mercaptobutanoic acid, 3-aminopropanol, 3-mercaptopropanol, N-(3-aminopropyl)-1,3-propanediamine, 3-(bis(3-aminopropyl)amino)propane-1-ol, 1-thioglycerol, dimercaprol, 1-mercapto-2-butanol, 1-mercapto-2-pentanol, 3-mercapto-1-propanol, 2,3-dimercapto-1-propanol, diethanolamine, 2-(2-aminoethyl)aminoethanol, dimethylenetriamine, 1,1-oxybismethylamine, 1,1-thiobismethylamine, 2-[(2-aminoethyl)amino]ethanethiol, bis(2-mercaptoethyl)amine, 2-aminoethane-1-thiol, 1-amino-2-butanol, 1-amino-2-pentanol, L-cysteine, D-cysteine, 3-amino-1-propanol, L-homoserine, D-homoserine, aminohydroxyacetic acid, L-lactic acid, D-lactic acid, L-malic acid, D-malic acid, glyceric acid, 2-hydroxybutyric acid, L-tartaric acid, D-tartaric acid, tartronic acid, and derivatives thereof.

The complex stability constant K1 of the polydentate ligand with respect to the metal atom contained in the semiconductor quantum dot is preferably 6 or more, more preferably 8 or more, and still more preferably 9 or more. In a case where the complex stability constant K1 is 6 or more, the strength of the bond between the semiconductor quantum dot and the polydentate ligand can be increased. For this reason, it is possible to suppress the peeling of the polydentate ligand from the semiconductor quantum dot, and as a result, it is possible to improve driving durability and the like.

The complex stability constant K1 is a constant determined by the relationship between a ligand and a metal atom which is a target of the coordinate bond, and it is represented by Expression (b).

Complex stability constant $K1=[ML]/([M]\times[L])$ (b)

In Expression (b), [ML] represents the molar concentration of a complex formed by bonding a metal atom to a ligand, [M] represents the molar concentration of a metal atom contributing to the coordinate bond, and [L] represents the molar concentration of the ligand.

Practically, a plurality of ligands may be coordinated to one metal atom. However, in the present invention, the complex stability constant K1 represented by Expression (b) in a case where one ligand molecule is coordinated to one metal atom is defined as an indicator of the strength of the coordinate bond.

The complex stability constant K1 between the ligand and the metal atom can be determined by spectroscopy, magnetic resonance spectroscopy, potentiometry, solubility measurement, chromatography, calorimetry, solidifying point measurement, vapor pressure measurement, relaxation measurement, viscosity measurement, surface tension measurement, or the like. In the present invention, the complex stability constant K1 is determined using Sc-Database ver. 5.85 (Academic Software) (2010), which summarizes results from various methods and research institutes. In a case where the complex stability constant K1 is not present in the Sc-Database ver. 5.85, a value described in Critical Stability Constants, written by A. E. Martell and R. M. M. Smith, is used. In a case where the complex stability constant K1 is not described in the Critical Stability Constants, the above-described measurement method is used or a program PKAS method that calculates the complex stability constant K1 (The Determination and Use of Stability Constants, VCH (1988) written by A. E. Martell et. al.) is used to calculate the complex stability constant K1.

In the present invention, a semiconductor quantum dot containing a Pb atom (more preferably, PbS is used) is used as the semiconductor quantum dot, the complex stability constant K1 of the polydentate ligand with respect to the Pb atom is preferably 6 or more, more preferably 8 or more, and still more preferably 9 or more. Examples of the compound having a complex stability constant K1 of 6 or more with respect to the Pb atom include thioglycolic acid (complex stability constant K1 with respect to Pb=8.5) and 2-mercaptoethanol (complex stability constant K1 with respect to Pb=6.7).

The photoelectric conversion layer containing aggregates of the semiconductor quantum dots and a ligand that is coordinated to the semiconductor quantum dot can be formed by undergoing a step (a semiconductor quantum dot aggregate forming step) of applying a semiconductor quantum dot dispersion liquid containing semiconductor quantum dots, a ligand that is coordinated to the semiconductor quantum dot, and a solvent onto a substrate to form a film of aggregates of the semiconductor quantum dots. That is, the manufacturing method for a photodetector element according to the embodiment of the present invention preferably include a step of using a semiconductor quantum dot dispersion liquid that contains semiconductor quantum dots, a ligand that is coordinated to the semiconductor quantum dot, and a solvent, to form a film of aggregates of the semiconductor quantum dots.

The method for applying a semiconductor quantum dot dispersion liquid onto a substrate is not particularly limited. Examples thereof include coating methods such as a spin coating method, a dipping method, an inkjet method, a dispenser method, a screen printing method, a relief printing method, an intaglio printing method, and a spray coating method.

The content of the semiconductor quantum dot in the semiconductor dot dispersion liquid is preferably 1 to 500 mg/mL, more preferably 10 to 200 mg/mL, and still more preferably 20 to 100 mg/mL.

In addition, after forming a film of aggregates of the semiconductor quantum dots, a ligand exchange step may be further carried out to exchange the ligand coordinated to the semiconductor quantum dot with another ligand. In the ligand exchange step, a ligand solution containing a ligand A and a solvent is applied onto the film of aggregates of the semiconductor quantum dots, formed by the semiconductor quantum dot aggregate forming step, to exchange the ligand coordinated to the semiconductor quantum dot with the ligand A. Two kinds of ligand solutions may be used in combination. In addition, the ligand solution may contain two or more kinds of ligands A.

A rinsing step of bringing a rinsing liquid into contact with the film of aggregates of the semiconductor quantum dots after the ligand exchange step to rinse the film may be carried out. In a case where the rinsing step is included, it is possible to remove the excess ligand contained in the film and the ligand eliminated from the semiconductor quantum dots. In addition, it is possible to remove the remaining solvent and other impurities. As the rinsing liquid, the solvent contained in the semiconductor quantum dot dispersion liquid or the ligand solution can be used; however, it is preferably an aprotic solvent and more preferably an aprotic polar solvent due to the reason that it is easy to more effectively remove the excess ligand contained in the film or the ligand eliminated from the semiconductor quantum dot. The boiling point of the rinsing liquid is preferably 120° C. or lower, more preferably 100° C. or lower, and still more preferably 90° C. or lower, due to the reason that it is easy to remove the rinsing liquid after the film is formed. The boiling point of the rinsing liquid is preferably 30° C. or higher, more preferably 40° C. or higher, and still more preferably 50° C. or higher, due to the reason that it is possible to avoid unnecessary concentration during the operation. From the above, the boiling point of the rinsing liquid is preferably 50° C. to 90° C. Specific examples of the aprotic solvent include acetonitrile, acetone, dimethylformamide, and dimethyl sulfoxide, and acetonitrile or acetone is preferable due to the reason that it has a low boiling point and hardly remains in the film.

In the rinsing step, the rinsing liquid may be poured onto the film of aggregates of the semiconductor quantum dots, or the film of aggregates of the semiconductor quantum dots may be immersed in the rinsing liquid. In addition, the rinsing step may be carried out after the semiconductor quantum dot aggregate forming step or after the ligand exchange step. In addition, it may be carried out after repeating the set of the semiconductor quantum dot aggregate forming step and the ligand exchange step.

It is preferable that the amount of metal impurities contained in the solvent used in the semiconductor quantum dot dispersion liquid, the ligand solution, and the rinsing liquid is small, and the metal content is, for example, 10 ppb (parts per billion) by mass or less. A solvent of a level of ppt (parts per trillion) by mass may be used as necessary, and such a solvent is provided by, for example, TOAGOSEI Co., Ltd. (The Chemical Daily, Nov. 13, 2015). Examples of the method for removing impurities such as metals from the solvent include distillation (molecular distillation, thin film distillation, and the like) and filtration using a filter. The filter pore diameter of the filter that is used for filtration is preferably 10 µm or less, more preferably 5 µm or less, and still more preferably 3 µm or less. A material of the filter is preferably polytetrafluoroethylene, polyethylene, or nylon. The solvent may contain isomers (compounds having the same number of atoms but having different structures). In addition, only one kind of isomer may be contained, or a plurality of kinds thereof may be contained.

A drying step may be further included in the formation of the photoelectric conversion layer. The drying step may be a dispersion liquid drying step of drying and removing the solvent remaining in the aggregates of the semiconductor quantum dots after the semiconductor quantum dot aggregate forming step or a solution drying step of drying the ligand solution after the ligand exchange step. In addition, it may be an integral step that is carried out after repeating the set of the semiconductor quantum dot aggregate forming step and the ligand exchange step.

On the other hand, a desired ligand may be applied onto the surface of the semiconductor quantum dot in advance in the semiconductor quantum dot dispersion liquid, and this dispersion liquid may be applied onto the substrate to form a photoelectric conversion layer. In this case, the above-described ligand exchange step is unnecessary. The semiconductor quantum dot dispersion liquid in which a desired ligand is coordinated in advance can be prepared, for example, by bringing semiconductor quantum dots (ligand: oleic acid) dispersed in a hydrophobic solvent (toluene, octane, hexane, or the like) into contact with a solution containing a polar solvent (dimethylformamide (DMF), dimethylsulfoxide (DMSO), or the like) and a desired ligand such as a halide of lead to cause ligand exchange, and exchanging the oleic acid coordinated to the semiconductor quantum dot with a desired ligand such as a halide of lead. At this time, the semiconductor quantum dots are dispersed in the polar solvent. Examples of the desired ligand after exchange include the above-described inorganic halide and the above-described polydentate ligand such as thioglycerol. In addition, for the dispersion solvent of the semiconductor quantum dots after the ligand exchange, a polar solvent may be used as it is, or a relatively single-chain amine such as butylamine may be substituted therefor.

In the photodetector element 1 illustrated in FIG. 1, the wavelength A. of the target light to be detected by the photodetector element 1 and the optical path length $L^\lambda$ of the light having the wavelength λ from a surface 12a of the second electrode layer 12 on a side of the photoelectric conversion layer 13 to a surface 13a of the photoelectric conversion layer 13 on a side of the first electrode layer satisfy the relationship of Expression (1) and preferably satisfy the relationship of Expression (2).

In addition, the thickness of the photoelectric conversion layer 13 is preferably 10 to 600 nm, more preferably 50 to 600 nm, still more preferably 100 to 600 nm, and even still more preferably 150 to 600 nm. The upper limit of the thickness of the photoelectric conversion layer 13 is preferably 550 nm or less, more preferably 500 nm or less, and still more preferably 450 nm or less.

The refractive index of the photoelectric conversion layer 13 with respect to the light of the target wavelength to be detected by the photodetector element is preferably 2.0 to 3.0, more preferably 2.1 to 2.8, and still more preferably 2.2 to 2.7. According to this aspect, in the configuration of the photodiode, it is easy to realize a high light absorbance, that is, a high quantum efficiency.

Although not illustrated in the drawing, a transparent substrate may be arranged on the surface of the first electrode layer 11 on the light incident side (the surface opposite to the side of the photoelectric conversion layer 13). Examples of the kind of transparent substrate include a glass substrate, a resin substrate, and a ceramic substrate.

In addition, although not illustrated in the drawing, an interlayer may be provided between the photoelectric conversion layer 13 and the second electrode layer 12 and/or between the photoelectric conversion layer 13 and the first electrode layer 11. Examples of the interlayer include a blocking layer and a charge transport layer. Examples of the charge transport layer include an electron transport layer and a hole transport layer.

The blocking layer is a layer having a function of preventing a reverse current. The blocking layer is also called a short circuit prevention layer. Examples of the material that forms the blocking layer include silicon oxide, magnesium oxide, aluminum oxide, calcium carbonate, cesium carbonate, polyvinyl alcohol, polyurethane, titanium oxide, tin oxide, zinc oxide, niobium oxide, tungsten oxide, and molybdenum oxide. The blocking layer may be a single-layer film or a laminated film having two or more layers. The thickness of the blocking layer is preferably 1 to 500 nm. The upper limit thereof is preferably 300 nm or less, more preferably 200 nm or less, and still more preferably 100 nm or less. The lower limit thereof is preferably 5 nm or more, more preferably 10 nm or more, and still more preferably 20 nm or more. The thickness of the blocking layer is preferably 0.01 to 5 times, more preferably 0.05 to 3 times, and still more preferably 0.1 to 1 times the thickness of the photoelectric conversion layer 13.

The electron transport layer is a layer having a function of transporting electrons generated in the photoelectric conversion layer 13 to the first electrode layer 11 or the second electrode layer 12. The electron transport layer is also called a hole block layer. The electron transport layer is formed of an electron transport material capable of exhibiting this function. Examples of the electron transport material include a fullerene compound such as [6,6]-phenyl-C61-butyric acid methyl ester ($PC_{61}BM$), a perylene compound such as perylenetetracarboxylic diimide, tetracyanoquinodimethane, titanium oxide, tin oxide, zinc oxide, indium oxide, indium tungsten oxide, indium zinc oxide, indium tin oxide, and fluorine-doped tin oxide. The electron transport layer may be a single-layer film or a laminated film having two or more layers. The thickness of the electron transport layer is preferably 10 to 1,000 nm. The upper limit thereof is preferably 800 nm or less. The lower limit thereof is preferably 20 nm or more and more preferably 50 nm or more. In addition, the thickness of the electron transport layer is preferably 0.05 to 10 times, more preferably 0.1 to 5 times, and still more preferably 0.2 to 2 times the thickness of the photoelectric conversion layer 13.

The hole transport layer is a layer having a function of transporting holes generated in the photoelectric conversion layer 13 to the first electrode layer 11 or the second electrode layer 12. The hole transport layer is also called an electron block layer. The hole transport layer is formed of a hole transport material capable of exhibiting this function. Examples of the hole transport material include PEDOT:PSS (poly(3,4-ethylenedioxythiophene):poly(4-styrenesulfonic acid)), 4,4',4"-tris[2-naphthyl(phenyl)amino]triphenylamine, and $MoO_3$. In addition, the organic hole transport material disclosed in paragraph Nos. 0209 to 0212 of JP2001-291534A can also be used. In addition, a semiconductor quantum dot can also be used as the hole transport material. Examples of the semiconductor quantum dot material that constitutes the semiconductor quantum dot include a nano particle (a particle having a size of 0.5 nm or more and less than 100 nm) of a general semiconductor crystal [a) a Group IV semiconductor, b) a compound semiconductor of a Group IV to IV element, a Group III to V element, or a Group II to VI element, or c) a compound semiconductor consisting of a combination of three or more of a Group II element, a Group III element, a Group IV element, a Group V element, and a Group VI element]. Specific examples thereof include semiconductor materials having a relatively narrow band gap, such as PbS, PbSe, PbSeS, InN, InAs, Ge, InAs, InGaAs, CuInS, CuInSe, CuInGaSe, InSb, HgTe, HgCdTe, $Ag_2S$, $Ag_2Se$, $Ag_2Te$, SnS, SnSe, SnTe, Si, and InP. A ligand may be coordinated on the surface of the semiconductor quantum dot. The thickness of the hole transport layer is preferably 1 to 1,000 nm. The upper limit thereof is preferably 800 nm or less, more preferably 500 nm or less, and still more preferably 300 nm or less. The lower limit thereof is preferably 5 nm or more, more preferably 10 nm or more, and still more preferably 20 nm or more. In addition, the thickness of the hole transport layer is preferably 0.01 to 5 times, more preferably 0.05 to 3 times, and still more preferably 0.1 to 1 time the thickness of the photoelectric conversion layer 13.

The photodetector element preferably has a charge transport layer between the photoelectric conversion layer 13 and the second electrode layer 12. Among the above, due to the reason that the transport efficiency of electrons and holes can be further increased and the external quantum efficiency can be further increased, it is more preferable that the electron transport layer is provided as a charge transport layer at any one of a gap between the photoelectric conversion layer 13 and the second electrode layer 12 or a gap between the photoelectric conversion layer 13 and the first electrode layer 11, and the hole transport layer is provided as a charge transport layer at the other gap. An aspect in which the electron transport layer is provided between the first electrode layer 11 and the photoelectric conversion layer 13 and the hole transport layer is provided between the second electrode layer 12 and the photoelectric conversion layer 13 is more preferable. The hole transport layer and the electron transport layer may be a single-layer film or a laminated film having two or more layers.

In a case where the charge transport layer is provided between the photoelectric conversion layer 13 and the second electrode layer 12, the thickness of the charge transport layer positioned between the photoelectric conversion layer 13 and the second electrode layer 12 (hereinafter, also referred to as the charge transport layer A) is preferably 1 to 1,000 nm. The upper limit thereof is preferably 800 nm or less and more preferably 500 nm or less. The lower limit thereof is preferably 5 nm or more, more preferably 10 nm or more, and still more preferably 20 nm or more. In addition, the thickness of the charge transport layer A is preferably 0.01 to 5 times, more preferably 0.05 to 3 times, and still more preferably 0.1 to 1 time the thickness of the photoelectric conversion layer 13. The charge transport layer A may be a single-layer film or a laminated film having two or more layers.

In a case where the charge transport layer is provided between the photoelectric conversion layer 13 and the first electrode layer 11, the thickness of the charge transport layer positioned between the photoelectric conversion layer 13 and the first electrode layer 11 (hereinafter, also referred to as the charge transport layer B) is preferably 10 to 1,000 nm. The upper limit thereof is preferably 800 nm or less. The lower limit thereof is preferably 20 nm or more and more preferably 50 nm or more. In addition, the thickness of the charge transport layer B is preferably 0.05 to 10 times, more preferably 0.1 to 5 times, and still more preferably 0.2 to 2 times the thickness of the photoelectric conversion layer 13. The charge transport layer B may be a single-layer film or a laminated film having two or more layers.

<Image Sensor>

The image sensor according to the embodiment of the present invention includes the above-described photodetector element according to the embodiment of the present invention. The configuration of the image sensor is not particularly limited as long as it has the photodetector element according to the embodiment of the present invention and it is a configuration that functions as an image sensor.

The image sensor according to the embodiment of the present invention may include an infrared transmission filter layer. The infrared transmission filter layer preferably has a low light transmittance in the wavelength range of the visible region, more preferably has an average light transmittance of 10% or less, still more preferably 7.5% or less, and particularly preferably 5% or less in a wavelength range of 400 to 650 nm.

Examples of the infrared transmission filter layer include those composed of a resin film containing a coloring material. Examples of the coloring material include a chromatic coloring material such as a red coloring material, a green coloring material, a blue coloring material, a yellow coloring material, a purple coloring material, and an orange coloring material, and a black coloring material. It is preferable that the coloring material contained in the infrared transmission filter layer forms a black color with a combination of two or more kinds of chromatic coloring materials or a coloring material containing a black coloring material. Examples of the combination of the chromatic coloring material in a case of forming a black color by a combination of two or more kinds of chromatic coloring materials include the following aspects (C1) to (C7).

(C1) an aspect containing a red coloring material and a blue coloring material.

(C2) an aspect containing a red coloring material, a blue coloring material, and a yellow coloring material.

(C3) an aspect containing a red coloring material, a blue coloring material, a yellow coloring material, and a purple coloring material.

(C4) an aspect containing a red coloring material, a blue coloring material, a yellow coloring material, a purple coloring material, and a green coloring material.

(C5) an aspect containing a red coloring material, a blue coloring material, a yellow coloring material, and a green coloring material.

(C6) an aspect containing a red coloring material, a blue coloring material, and a green coloring material.

(C7) an aspect containing a yellow coloring material and a purple coloring material.

The chromatic coloring material may be a pigment or a dye. The infrared transmission filter layer may contain a pigment and a dye. The black coloring material is preferably an organic black coloring material. Examples of the organic black coloring material include a bisbenzofuranone compound, an azomethine compound, a perylene compound, and an azo compound.

The infrared transmission filter layer may further contain an infrared absorber. In a case where the infrared absorber is contained in the infrared transmission filter layer, the wavelength of the light to be transmitted can be shifted to the longer wavelength side. Examples of the infrared absorber include a pyrrolo pyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride.

The spectral characteristics of the infrared transmission filter layer can be appropriately selected according to the use application of the image sensor. Examples of the filter layer include those that satisfy any one of the following spectral characteristics of (1) to (5).

(1): A filter layer in which the maximum value of the light transmittance in the film thickness direction in a wavelength range of 400 to 750 nm is 20% or less (preferably 15% or less and more preferably 10% or less), and the minimum value of the light transmittance in the film thickness direction in a wavelength range of 900 to 1,500 nm is 70% or more (preferably 75% or more and more preferably 80% or more).

(2): A filter layer in which the maximum value of the light transmittance in the film thickness direction in a wavelength range of 400 to 830 nm is 20% or less (preferably 15% or less and more preferably 10% or less), and the minimum value of the light transmittance in the film thickness direction in a wavelength range of 1,000 to 1,500 nm is 70% or more (preferably 75% or more and more preferably 80% or more).

(3): A filter layer in which the maximum value of the light transmittance in the film thickness direction in a wavelength range of 400 to 950 nm is 20% or less (preferably 15% or less and more preferably 10% or less), and the minimum value of the light transmittance in the film thickness direction in a wavelength range of 1,100 to 1,500 nm is 70% or more (preferably 75% or more and more preferably 80% or more).

(4): A filter layer in which the maximum value of the light transmittance in the film thickness direction in a wavelength range of 400 to 1,100 nm is 20% or less (preferably 15% or less and more preferably 10% or less), and the minimum value thereof in a wavelength range of 1,400 to 1,500 nm is 70% or more (preferably 75% or more and more preferably 80% or more).

(5): A filter layer in which the maximum value of the light transmittance in the film thickness direction in a wavelength range of 400 to 1,300 nm is 20% or less (preferably 15% or less and more preferably 10% or less), and the minimum value thereof in a wavelength range of 1,600 to 2,000 nm is 70% or more (preferably 75% or more and more preferably 80% or more).

Further, as the infrared transmission filter, the films disclosed in JP2013-077009A, JP2014-130173A, JP2014-130338A, WO2015/166779A, WO2016/178346A, WO2016/190162A, WO2018/016232A, JP2016-177079A, JP2014-130332A, and WO2016/027798A can be used. As the infrared transmission filter, two or more filters may be used in combination, or a dual bandpass filter that transmits through two or more specific wavelength regions with one filter may be used.

The image sensor according to the embodiment of the present invention may include an infrared shielding filter for the intended purpose of improving various performances such as noise reduction. Specific examples of the infrared shielding filter include the filters disclosed in WO2016/186050A, WO2016/035695A, JP6248945B, WO2019/021767A, JP2017-067963A, and JP6506529B.

The image sensor according to the embodiment of the present invention may include a dielectric multi-layer film. Examples of the dielectric multi-layer film include those in which a plurality of layers are laminated by alternately laminating a dielectric thin film having a high refractive index (a high refractive index material layer) and a dielectric thin film having a low refractive index (a low refractive index material layer). The number of laminated layers of the dielectric thin film in the dielectric multi-layer film is not particularly limited; however, it is preferably 2 to 100 layers, more preferably 4 to 60 layers, and still more preferably 6 to 40 layers. The material that is used for forming the high refractive index material layer is preferably a material having a refractive index of 1.7 to 2.5. Specific examples thereof include $Sb_2O_3$, $Sb_2S_3$, $Bi_2O_3$, $CeO_2$, $CeF_3$, $HfO_2$, $La_2O_3$, $Nd_2O_3$, $Pr_6O_{11}$, $Sc_2O_3$, SiO, $Ta_2O_5$, $TiO_2$, TlCl, $Y_2O_3$, ZnSe, ZnS, and $ZrO_2$. The material that is used for forming the low refractive index material layer is preferably a material having a refractive index of 1.2 to 1.6. Specific examples thereof include $Al_2O_3$, $BiF_3$, $CaF_2$, $LaF_3$, $PbCl_2$, $PbF_2$, LiF, $MgF_2$, MgO, $NdF_3$, $SiO_2$, $Si_2O_3$, NaF, $ThO_2$, $ThF_4$, and $Na_3AlF_6$. The method for forming the dielectric multi-layer film is not particularly limited; however, examples thereof include ion plating, a vacuum deposition method using an ion beam or the like, a physical vapor deposition method (a PVD method) such as sputtering, and a chemical vapor deposition method (a CVD method). The thickness of each of the high refractive index material layer and the low refractive index material layer is preferably $0.1\lambda$ to $0.5\lambda$ in a case where the wavelength of the light to be blocked is $\lambda$ (nm). Specific examples of the usable dielectric multi-layer film include the films disclosed in JP2014-130344A and JP2018-010296A.

In the dielectric multi-layer film, the transmission wavelength range is preferably present in the infrared region (preferably a wavelength range having a wavelength of more than 700 nm, more preferably a wavelength range having a wavelength of more than 800 nm, and still more preferably a wavelength range having a wavelength of more than 900 nm). The maximum transmittance in the transmission wavelength range is preferably 70% or more, more preferably 80% or more, and still more preferably 90% or more. In addition, the maximum transmittance in the shielding wavelength range is preferably 20% or less, more preferably 10% or less, and still more preferably 5% or less. In addition, the average transmittance in the transmission wavelength range is preferably 60% or more, more preferably 70% or more, and still more preferably 80% or more. In addition, in a case where the wavelength at which the maximum transmittance is exhibited is denoted by a central wavelength $\lambda_{t1}$, the wavelength range of the transmission wavelength range is preferably "the central wavelength $\lambda_{t1} \pm 100$ nm", more preferably "the central wavelength $\lambda_{t1} \pm 75$ nm", and still more preferably "the central wavelength $\lambda_{t1} \pm 50$ nm".

The dielectric multi-layer film may have only one transmission wavelength range (preferably, a transmission wavelength range having a maximum transmittance of 90% or more) or may have a plurality of transmission wavelength ranges.

The image sensor according to the embodiment of the present invention may include a color separation filter layer. Examples of the color separation filter layer include a filter layer including colored pixels. Examples of the kind of colored pixel include a red pixel, a green pixel, a blue pixel, a yellow pixel, a cyan pixel, and a magenta pixel. The color separation filter layer may include colored pixels having two or more colors or having only one color. It can be appropriately selected according to the use application and the intended purpose. For example, the filter disclosed in WO2019/039172A can be used.

In addition, in a case where the color separation layer includes colored pixels having two or more colors, the colored pixels of the respective colors may be adjacent to each other, or a partition wall may be provided between the respective colored pixels. The material of the partition wall is not particularly limited. Examples thereof include an organic material such as a siloxane resin or a fluororesin, and an inorganic particle such as a silica particle. In addition, the partition wall may be composed of a metal such as tungsten or aluminum.

In a case where the image sensor according to the embodiment of the present invention includes an infrared transmission filter layer and a color separation layer, it is preferable that the color separation layer is provided on an optical path different from the infrared transmission filter layer. In addition, it is also preferable that the infrared transmission filter layer and the color separation layer are arranged two-dimensionally. The fact that the infrared transmission filter layer and the color separation layer are two-dimensionally arranged means that at least a part of both is present on the same plane.

The image sensor according to the embodiment of the present invention may include an interlayer such as a planarizing layer, an underlying layer, or an intimate attachment layer, an anti-reflection film, and a lens. As the anti-reflection film, for example, a film prepared from the composition disclosed in WO2019/017280A can be used. As the lens, for example, the structure disclosed in WO2018/092600A can be used.

The photodetector element according to the embodiment of the present invention has excellent sensitivity to light having a wavelength in the infrared region. As a result, the image sensor according to the embodiment of the present invention can be preferably used as an infrared image sensor. In addition, the image sensor according to the embodiment of the present invention can be preferably used as a sensor that senses light having a wavelength of 900 to 2,000 nm and can be more preferably used as a sensor that senses light having a wavelength of 900 to 1,600 nm.

EXAMPLES

Test Example 1

Hereinafter, the present invention will be described more specifically with reference to Examples. Materials, amounts used, proportions, treatment details, treatment procedures, and the like shown in the following examples can be appropriately changed without departing from the gist of the present invention. Accordingly, a scope of the present invention is not limited to the following specific examples.

(Preparation of Dispersion Liquid of PbS Quantum Dots)

6.74 mL of oleic acid, 6.3 mmol of lead oxide, and 30 mL of octadecene were weighed and taken in a flask and heated at 120° C. under vacuum for 100 minutes to obtain a precursor solution. Then, the temperature of the solution was adjusted to 100° C., the system subsequently was made into a nitrogen flow state, and subsequently, 2.5 mmol of hexamethyldisilathiane was injected together with 5 mL of octadecene.

After holding for 1 minute after the injection, the flask was naturally cooled, and at the stage where the temperature reached 30° C., 40 mL of toluene was added thereto, and a solution was recovered. An excess amount of ethanol was added to the solution, centrifugation was carried out at 10,000 rpm for 10 minutes, and the precipitate was dispersed in octane, to obtain a dispersion liquid (concentration: 10 mg/mL) of PbS quantum dots, in which oleic acid was coordinated as a ligand on the surface of the PbS quantum dot. The band gap of the PbS quantum dot in the obtained dispersion liquid of PbS quantum dot was estimated from light absorption measurement in the visible to infrared region by using an ultraviolet-visible-near-infrared spectrophotometer (V-670, manufactured by JASCO Corporation), and it was approximately 1.32 eV.

(Preparation of Photodetector Element)

A quartz glass substrate was prepared, and indium oxide (ITO) doped with tin was formed into a film of 100 nm on the quartz glass substrate by a sputtering method to form an ITO electrode layer. The ITO electrode layer is the first electrode layer in the present invention. Titanium oxide was formed into a film on the ITO electrode layer by sputtering to form a titanium oxide layer (an electron transport layer) having a thickness of 20 nm.

Next, the above dispersion liquid of PbS quantum dots was added dropwise onto the titanium oxide layer formed on the substrate, and spin coating was carried out at 2,500 rpm to form a PbS quantum dot aggregate film (a step 1). Next, a methanol solution of zinc iodide (25 mmol/L) and a methanol solution of thioglycolic acid (concentration: 0.01% by volume) was added as the ligand solution dropwise onto the PbS quantum dot aggregate film, allowed to stand for 1 minute, and spin drying was carried out at 2,500 rpm. Next, methanol was added dropwise onto the PbS quantum dot aggregate film, and spin drying was carried at 2,500 rpm for 20 seconds to carry out the ligand exchange of the ligand coordinated to the PbS quantum dot from oleic acid to thioglycolic acid and zinc iodide (a step 2). The operation of the step 1 and step 2 as one cycle was repeated for a plurality of cycles, and a photoelectric conversion layer, which is the PbS quantum dot aggregate film in which the ligand had been subjected to ligand exchange from oleic acid to thioglycolic acid and zinc iodide, was formed to the thickness described in the table below.

Next, 4,4',4''-tris[2-naphthyl(phenyl)amino]triphenylamine (2-TNATA) was vacuum-deposited on the photoelectric conversion layer to form a 2-TNATA film (a hole transport layer) having the thicknesses described in the table below. The thickness of the 2-TNATA film was adjusted by controlling the vapor deposition time.

Next, gold was formed into a film on the hole transport layer to a thickness of 100 nm by vapor deposition to form a gold electrode layer (a second electrode layer), whereby a photodiode-type photodetector element was obtained.

(Evaluation of External Quantum Efficiency)

The external quantum efficiency was measured when each photodetector element was irradiated with monochrome light (100 μW/cm$^2$) having a wavelength of 940 nm in a state where a reverse voltage of 2 V was applied thereto. The external quantum efficiency was estimated by "external quantum efficiency=(number of photoelectrons/number of irradiated photons)×100" from the number of photoelectrons estimated from the difference between a current value in a case of not being irradiated with light and a current value in a case of being irradiated with light, and the number of irradiated photons.

The table below shows the external quantum efficiency of each photodetector element with respect to the light having a wavelength of 940 nm.

It is noted that in this Test Example, the target light to be detected by the photodetector element is light having a wavelength of 940 nm. The table below shows the film thicknesses of the photoelectric conversion layer and the 2-TNATA film (the hole transport layer) and the optical path length of the light having a wavelength of 940 nm. In the prepared photodetector element, the refractive index of the photoelectric conversion layer was 2.57, and the refractive index of the 2-TNATA film (the hole transport layer) was 1.67 with respect to the light having a wavelength of 940 nm. The refractive index was calculated from the transmission spectrum and the reflection spectrum. The spectrum was measured using a spectrophotometer U-4000 manufactured by Hitachi High-Tech Science Corporation. The table below also shows the value of $L^\lambda/\lambda$. $L^\lambda$ is the optical path length $L^\lambda$ of the light having a wavelength of 940 nm from a surface of the second electrode layer (the gold electrode layer) on a side of the photoelectric conversion layer to a surface of the photoelectric conversion layer on a side of the first electrode layer (the ITO electrode layer), and $\lambda$ is the wavelength of the target light to be detected by the photodetector element, which is 940 nm in this Test Example.

TABLE 1

| | Photoelectric conversion layer | | 2-TNATA film (hole transport layer) | | | |
|---|---|---|---|---|---|---|
| | Film thickness (nm) | Optical path length (nm) | Film thickness (nm) | Optical path length (nm) | $L^\lambda/\lambda$ | External quantum efficiency (%) |
| Example 1 | 100 | 257 | 247 | 414 | 0.21 + 0.50 | 48.3 |
| Example 2 | 200 | 513 | 38 | 63 | 0.11 + 0.50 | 64.1 |
| Example 3 | 400 | 1026 | 110 | 183 | 0.29 + 1.00 | 60.1 |
| Example 4 | 500 | 1283 | 202 | 338 | 0.23 + 1.50 | 90.4 |
| Comparative Example 1 | 100 | 257 | 152 | 254 | 0.04 + 0.50 | 22.0 |
| Comparative Example 2 | 100 | 257 | 331 | 555 | 0.36 + 0.50 | 22.6 |
| Comparative Example 3 | 200 | 513 | 199 | 334 | 0.40 + 0.50 | 28.1 |

As shown in the above table, the photodetector element of Example had a higher external quantum efficiency as compared with Comparative Example.

Test Example 2

(Preparation of Dispersion Liquid of PbS Quantum Dots)

22.5 mL of oleic acid, 2 mmol of lead oxide, and 19 mL of octadecene were weighed and taken in a flask and heated at 110° C. under vacuum for 90 minutes to obtain a precursor solution. Then, the temperature of the solution was adjusted to 95° C., and the system was made into a nitrogen flow state. Then 1 mmol of hexamethyldisilathiane was injected together with 5 mL of octadecene. Immediately after the injection, the flask was naturally cooled, and at the stage where the temperature reached 30° C., 12 mL of hexane was added thereto, and a solution was recovered. An excess amount of ethanol was added to the solution, centrifugation was carried out at 10,000 rpm for 10 minutes, and the precipitate was dispersed in octane, to obtain a dispersion liquid (concentration: 40 mg/mL) of PbS quantum dots, in which oleic acid was coordinated as a ligand on the surface of the PbS quantum dot. The band gap of the PbS quantum dot estimated from the absorption measurement of the dispersion liquid of the obtained PbS quantum dots was about 0.80 eV.

(Preparation of Photodetector Element)

A photodiode-type photodetector element was obtained in the same manner as in Test Example 1 except that the film thickness of the photoelectric conversion layer and the film thickness of the hole transport layer were set as described in the table below.

(Evaluation of External Quantum Efficiency)

The external quantum efficiency was measured when each photodetector element was irradiated with monochrome light (100 μW/cm$^2$) having a wavelength of 1,550 nm in a state where a reverse voltage of 2 V was applied thereto. The external quantum efficiency was estimated by "external quantum efficiency=(number of photoelectrons/number of irradiated photons)×100" from the number of photoelectrons estimated from the difference between a current value in a case of not being irradiated with light and a current value in a case of being irradiated with light, and the number of irradiated photons.

The table below shows the external quantum efficiency of each photodetector element with respect to the light having a wavelength of 1,550 nm.

It is noted that in this Test Example, the target light to be detected by the photodetector element is light having a wavelength of 1,550 nm. The table below shows the film thicknesses of the photoelectric conversion layer and the 2-TNATA film (the hole transport layer) and the optical path length of the light having a wavelength of 1,550 nm. In the prepared photodetector element, the refractive index of the photoelectric conversion layer was 2.51, and the refractive index of the 2-TNATA film (the hole transport layer) was 1.65 with respect to the light having a wavelength of 1,550 nm. The refractive index was calculated from the transmission spectrum and the reflection spectrum. The spectrum was measured using a spectrophotometer U-4000 manufactured by Hitachi High-Tech Science Corporation. The table below also shows the value of $L^\lambda/\lambda$. $L^\lambda$ is the optical path length $L^\lambda$ of the light having a wavelength of 1,550 nm from a surface of the second electrode layer (the gold electrode layer) on a side of the photoelectric conversion layer to a surface of the photoelectric conversion layer on a side of the first electrode layer (the ITO electrode layer), and $\lambda$ is the wavelength of the target light to be detected by the photodetector element, which is 1,550 nm in this Test Example.

TABLE 2

| | Photoelectric conversion layer | | 2-TNATA film (hole transport layer) | | | |
|---|---|---|---|---|---|---|
| | Film thickness (nm) | Optical path length (nm) | Film thickness (nm) | Optical path length (nm) | $L^\lambda/\lambda$ | External quantum efficiency (%) |
| Example 5 | 100 | 251 | 60 | 98 | 0.23 | 68.5 |
| Example 6 | 400 | 1005 | 75 | 123 | 0.23 + 0.50 | 82.0 |
| Comparative Example 4 | 200 | 502 | 36 | 59 | 0.36 | 15.3 |
| Comparative Example 5 | 200 | 502 | 203 | 334 | 0.04 + 0.50 | 16.1 |

As shown in the above table, the photodetector element of Example had a higher external quantum efficiency as compared with Comparative Example.

Test Example 3

(Preparation of Photodetector Element)

A photodiode-type photodetector element was obtained in the same manner as in Test Example 1 except that MoO$_3$ was formed into a film on the photoelectric conversion layer by a sputtering method in Test Example 1 to form a MoO$_3$ film (a hole transport layer) having the thickness described in the table below.

(Evaluation of External Quantum Efficiency)

The external quantum efficiency was measured when each photodetector element was irradiated with monochrome light (100 μW/cm$^2$) having a wavelength of 940 nm in a state where a reverse voltage of 2 V was applied thereto. The external quantum efficiency was estimated by "external quantum efficiency=(number of photoelectrons/number of irradiated photons)×100" from the number of photoelectrons estimated from the difference between a current value in a case of not being irradiated with light and a current value in a case of being irradiated with light, and the number of irradiated photons.

The table below shows the external quantum efficiency of each photodetector element with respect to the light having a wavelength of 940 nm.

It is noted that in this Test Example, the target light to be detected by the photodetector element is light having a wavelength of 940 nm. The table below shows the film thicknesses of the photoelectric conversion layer and the MoO$_3$ film (the hole transport layer) and the optical path length of the light having a wavelength of 940 nm. In the prepared photodetector element, the refractive index of the photoelectric conversion layer was 2.57, and the refractive index of the MoO$_3$ film (the hole transport layer) was 2.10 with respect to the light having a wavelength of 940 nm. The table below also shows the value of $L^\lambda/\lambda$. $L^\lambda$ is the optical path length $L^\lambda$ of the light having a wavelength of 940 nm from a surface of the second electrode layer (the gold electrode layer) on a side of the photoelectric conversion layer to a surface of the photoelectric conversion layer on a side of the first electrode layer (the ITO electrode layer), and $\lambda$ is the wavelength of the target light to be detected by the photodetector element, which is 940 nm in this Test Example.

TABLE 3

| | Photoelectric conversion layer | | 2-TNATA film (hole transport layer) | | | |
|---|---|---|---|---|---|---|
| | Film thickness (nm) | Optical path length (nm) | Film thickness (nm) | Optical path length (nm) | $L^\lambda/\lambda$ | External quantum efficiency (%) |
| Example 7 | 200 | 513 | 30 | 63 | 0.11 + 0.50 | 60.9 |
| Comparative Example 6 | 100 | 257 | 121 | 254 | 0.04 + 0.50 | 18.5 |

As shown in the above table, the photodetector element of Example had a higher external quantum efficiency as compared with Comparative Example.

In a case where an image sensor is prepared by a known method by using the photodetector element obtained in Example described and incorporating it into a solid-state imaging element together with an optical filter prepared according to the methods disclosed in WO2016/186050A and WO2016/190162A, it is possible to obtain an image sensor having good visible and infrared imaging performance.

In each embodiment, the same effect can be obtained even in a case where the semiconductor quantum dots of the photoelectric conversion layer are changed to PbSe quantum dots.

EXPLANATION OF REFERENCES

1: photodetector element
11: first electrode layer
12: second electrode layer
13: photoelectric conversion layer

What is claimed is:

1. A photodetector element comprising:
a photoelectric conversion layer that contains aggregates of semiconductor quantum dots between a first electrode layer and a second electrode layer,
wherein the first electrode layer is provided on a light incident side with respect to the second electrode layer,
wherein the photoelectric conversion layer contains a ligand that is coordinated to the semiconductor quantum dot,
wherein the ligand contains a ligand containing a halogen atom and a polydentate ligand containing two or more coordination moieties, and the ligand containing a halogen atom is a salt of a metal and the halogen atom, and
a wavelength λ (nm) of target light to be detected by the photodetector element and an optical path length $L^\lambda$ (nm) of light having the wavelength λ from a surface of the second electrode layer on a side of the photoelectric conversion layer to a surface of the photoelectric conversion layer on a side of the first electrode layer satisfy a relationship of the following Expression (1);

$$0.05 + m/2 \leq L^\lambda/\lambda \leq 0.35 + m/2 \quad (1)$$

in the expression, λ is the wavelength of the target light to be detected by the photodetector element,
$L^\lambda$ is the optical path length of the light having the wavelength λ from a surface of the second electrode layer on a side of the photoelectric conversion layer to a surface of the photoelectric conversion layer on a side of the first electrode layer, and
m is an integer of 0 or more.

2. The photodetector element according to claim 1,
wherein the wavelength λ of the target light to be detected by the photodetector element and the optical path length $L^\lambda$ of the light having the wavelength λ from a surface of the second electrode layer on a side of the photoelectric conversion layer to a surface of the photoelectric conversion layer on a side of the first electrode layer satisfy a relationship of the following Expression (2);

$$0.10 + m/2 \leq L_\lambda/2 \leq 0.30 + m/2 \quad (2)$$

in the expression, λ is the wavelength of the target light to be detected by the photodetector element,
$L^\lambda$ is the optical path length of the light having the wavelength λ from a surface of the second electrode layer on a side of the photoelectric conversion layer to a surface of the photoelectric conversion layer on a side of the first electrode layer, and
m is an integer of 0 or more.

3. The photodetector element according to claim 1, wherein m is an integer of 0 to 4.

4. The photodetector element according to claim 1, wherein m is an integer of 0 to 2.

5. The photodetector element according to claim 1, wherein the photoelectric conversion layer has a film thickness of 150 to 600 nm.

6. The photodetector element according to claim 1, wherein the semiconductor quantum dot contains a Pb atom.

7. The photodetector element according to claim 1, wherein the semiconductor quantum dot contains PbS.

8. The photodetector element according to claim 1, wherein a refractive index of the photoelectric conversion layer with respect to the light having the wavelength 2 is 2 to 3.

9. The photodetector element according to claim 1, further comprising a charge transport layer between the photoelectric conversion layer and the second electrode layer.

10. The photodetector element according to claim 1, wherein the target light to be detected by the photodetector element is light having a wavelength range of 900 to 1,600 nm.

11. A manufacturing method for the photodetector element according to claim 1, the manufacturing method comprising:
a step of using a semiconductor quantum dot dispersion liquid that contains the semiconductor quantum dots, the ligand that is coordinated to the semiconductor quantum dot, and a solvent, to form a film of aggregates of the semiconductor quantum dots.

12. An image sensor comprising the photodetector element according to claim 1.

* * * * *